US010490765B2

(12) United States Patent
Kim et al.

(10) Patent No.: US 10,490,765 B2
(45) Date of Patent: *Nov. 26, 2019

(54) ORGANIC LIGHT EMITTING DIODE DEVICE

(71) Applicant: SAMSUNG DISPLAY CO., LTD., Yongin-si, Gyeonggi-do (KR)

(72) Inventors: Seul-Ong Kim, Yongin-si (KR); Dong-Woo Shin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/973,650

(22) Filed: May 8, 2018

(65) Prior Publication Data

US 2018/0261789 A1    Sep. 13, 2018

Related U.S. Application Data

(63) Continuation of application No. 14/265,752, filed on Apr. 30, 2014, now Pat. No. 9,991,460.

(30) Foreign Application Priority Data

Jun. 10, 2013 (KR) .................. 10-2013-0066110

(51) Int. Cl.
C07D 209/82 (2006.01)
H01L 51/50 (2006.01)
H01L 51/00 (2006.01)

(52) U.S. Cl.
CPC ...... *H01L 51/5084* (2013.01); *H01L 51/5004* (2013.01); *H01L 51/5016* (2013.01); *H01L 51/5056* (2013.01); *H01L 51/5072* (2013.01); *H01L 51/0058* (2013.01); *H01L 51/0067* (2013.01); *H01L 51/0072* (2013.01); *H01L 51/0081* (2013.01); *H01L 51/0085* (2013.01); *H01L 51/506* (2013.01); *H01L 51/5076* (2013.01); *H01L 2251/308* (2013.01)

(58) Field of Classification Search
CPC ............ H01L 51/5004; H01L 51/5016; H01L 51/5056; H01L 51/5072; H01L 51/5084; H01L 51/0058; H01L 51/0067; H01L 51/0072; H01L 51/0081; H01L 51/0085; H01L 51/506; H01L 51/5076
See application file for complete search history.

(56) References Cited

U.S. PATENT DOCUMENTS

| 6,097,147 A | 8/2000 | Baldo et al. |
| 8,017,254 B2 | 9/2011 | Itai |
| 9,991,460 B2 * | 6/2018 | Kim ............ H01L 51/5084 |
| 2011/0240967 A1 | 10/2011 | Lee et al. |
| 2012/0098002 A1 | 4/2012 | Song et al. |
| 2012/0121933 A1 | 5/2012 | Ma et al. |

FOREIGN PATENT DOCUMENTS

| EP | 2 224 790 B1 | 1/2013 |
| JP | 2007-242733 A | 9/2007 |
| JP | 4712232 B2 | 9/2010 |
| KR | 10-2010-0062169 | 6/2010 |
| KR | 10-2011-0131128 | 12/2011 |
| KR | 10-2012-0004018 A | 1/2012 |
| KR | 10-2012-0042035 | 5/2012 |
| WO | WO 2012/005457 A2 | 1/2012 |

* cited by examiner

*Primary Examiner* — Deepak R Rao
(74) *Attorney, Agent, or Firm* — Lewis Roca Rothgerber Christie LLP

(57) ABSTRACT

Disclosed is an organic light emitting diode device including an anode and a cathode facing each other, an emission layer interposed between the anode and the cathode, and a first hole auxiliary layer interposed between the anode and the emission layer. The first hole auxiliary layer has a higher triplet energy (T1) than the emission layer.

23 Claims, 1 Drawing Sheet

[FIG. 1]
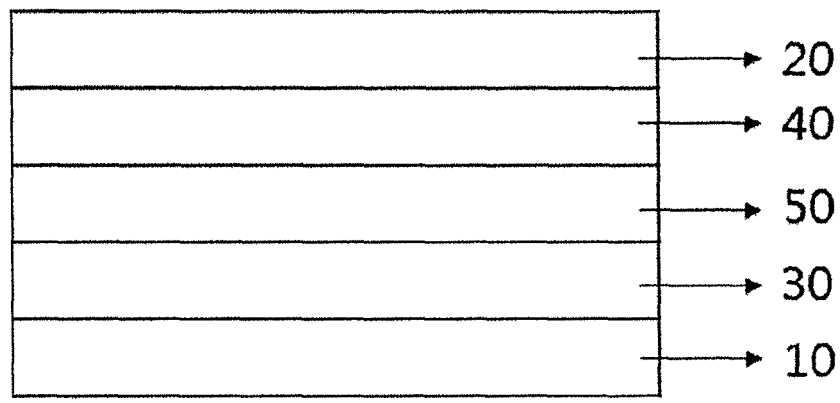
[FIG. 2]
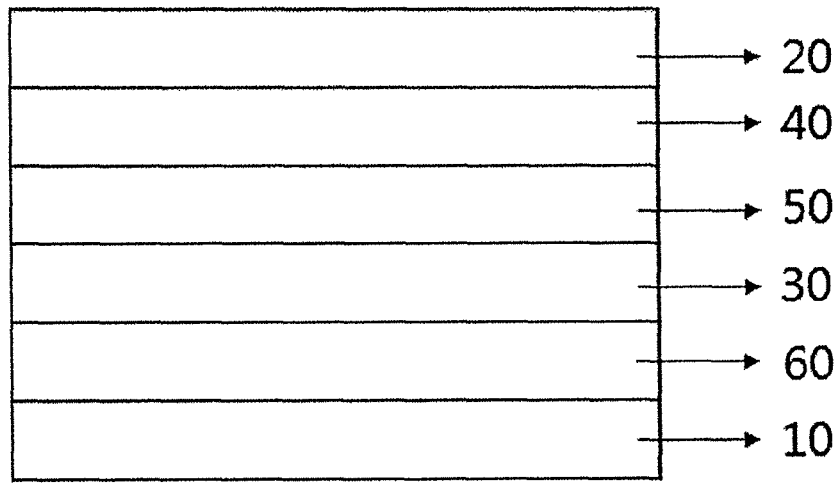

ORGANIC LIGHT EMITTING DIODE DEVICE

CROSS-REFERENCE TO RELATED APPLICATIONS

This is a continuation application based on pending application Ser. No. 14/265,752, filed Apr. 30, 2014, the entire contents of which is hereby incorporated by reference.

Korean Patent Application No. 10-2013-0066110, filed on Jun. 10, 2013, in the Korean Intellectual Property Office, and entitled: "Organic Light-Emitting Diode Device," is incorporated by reference herein in its entirety.

BACKGROUND

1. Field

An organic light emitting diode device is disclosed.

2. Description of the Related Art

Recent requests for reduced size and thickness of a monitor, a television, or the like has promoted replacement of a cathode ray tube (CRT) with a liquid crystal display (LCD).

SUMMARY

Embodiments may be realized by providing an organic light emitting diode device including an anode and a cathode facing each other, an emission layer interposed between the anode and the cathode, and a first hole auxiliary layer interposed between the anode and the emission layer. The first hole auxiliary layer has a higher triplet energy (T1) than that of the emission layer.

The emission layer may include a host and a dopant, and $$0.1 \text{ eV} + T_{Dopant} < T_{Host} < T_{HAL(1)} \quad \text{(Equation 1)}$$

wherein, in the Equation 1, $T_{Dopant}$ is a triplet energy (T1) level of the dopant, $T_{Host}$ is a triplet energy (T1) level of the host, and $T_{HAL(1)}$ is a triplet energy (T1) level of the first hole auxiliary layer.

The dopant may be a phosphorescent dopant.

In an embodiment, $$0.3 \text{ eV} + T_{Dopant} \leq T_{HAL(1)} \quad \text{(Equation 2)}$$

wherein, in the Equation 2, $T_{Dopant}$ is a triplet energy (T1) level of the dopant, and $T_{HAL(1)}$ is a triplet energy (T1) level of the first hole auxiliary layer.

The triplet energy (T1) of the first hole auxiliary layer may be in a range of about 2.4 to about 3.5 eV, and the triplet energy (T1) of the emission layer may be in a range of about 2.0 to about 3.0 eV.

The emission layer and the first hole auxiliary layer may be adjacent to each other.

The organic light emitting diode device may further include a second hole auxiliary layer between the first hole auxiliary layer and the anode.

The first hole auxiliary layer may include a compound having at least one carbazole group.

The first hole auxiliary layer may include a compound represented by one of Chemical Formulae 1 to 3:

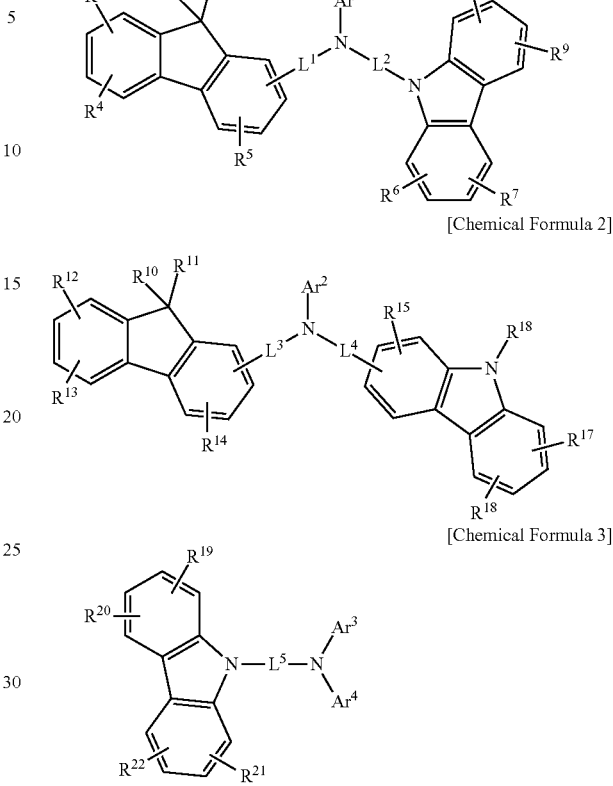

[Chemical Formula 1]

[Chemical Formula 2]

[Chemical Formula 3]

wherein, in Chemical Formulae 1 to 3,

X is nitrogen (N), boron (B), or phosphorus (P), $R^1$ to $R^{22}$ are each independently hydrogen, deuterium, a halogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C2 to C30 heteroaryl group, a substituted or unsubstituted C3 to C30 silyl group, or a combination thereof, $R^1$ to $R^{22}$ are present independently or form a fused ring with an adjacent substituent, $Ar^1$ to $Ar^4$ are each independently hydrogen, a substituted or unsubstituted C6 to C30 aryl group, a substituted or unsubstituted C2 to C30 heteroaryl group, or a combination thereof, $Ar^1$ to $Ar^4$ are present independently or form a fused ring with an adjacent substituent, and $L^1$ to $L^5$ are each independently a single bond, a substituted or unsubstituted C1 to C30 alkylene group, a substituted or unsubstituted C6 to C30 arylene group, a substituted or unsubstituted C2 to C30 heteroarylene group, or combination thereof.

The organic light emitting diode device may further include an electron auxiliary layer between the emission layer and the cathode.

In an embodiment, the emission layer may include a host and a dopant, and $$0.1 \text{ eV} + EA_{EAL} > EA_{Host} \quad \text{(Equation 3)}$$

$$0.1 \text{ eV} + EA_{EAL} > EA_{HAL(1)} \quad \text{(Equation 4)}$$

wherein, in the Equations 3 and 4, $EA_{EAL}$ is electron affinity of an electron auxiliary layer, $EA_{Host}$ is electron affinity of the host, and $EA_{HAL(1)}$ is electron affinity of the first hole auxiliary layer.

The electron auxiliary layer may have electron affinity in a range of about 2.4 to about 3.4 eV, the emission layer may have electron affinity in a range of about 2.0 to about 3.2 eV, and the first hole auxiliary layer may have electron affinity in a range of about 1.8 to about 3.0 eV.

The electron auxiliary layer may include a nitrogen-containing ring compound.

The nitrogen-containing ring may include a substituted or unsubstituted imidazole, a substituted or unsubstituted triazole, a substituted or unsubstituted tetrazole, a substituted or unsubstituted oxadiazole, a substituted or unsubstituted oxatriazole, a substituted or unsubstituted thiatriazole, a substituted or unsubstituted carbazole, a substituted or unsubstituted benzimidazole, a substituted or unsubstituted benztriazole, a substituted or unsubstituted pyridine, a substituted or unsubstituted pyrimidine, a substituted or unsubstituted triazine, a substituted or unsubstituted pyrazine, a substituted or unsubstituted pyridazine, a substituted or unsubstituted quinoline, a substituted or unsubstituted isoquinoline, a substituted or unsubstituted quinoxaline, a substituted or unsubstituted quinazoline, a substituted or unsubstituted acridine, a substituted or unsubstituted phenanthroline, a substituted or unsubstituted phenazine, a substituted or unsubstituted imidazopyridine, tris(8-hydroxyquinolinolato)aluminum, or a combination thereof.

The electron auxiliary layer may be thinner than the first hole auxiliary layer.

The dopant may be a phosphorescent dopant.

BRIEF DESCRIPTION OF THE DRAWINGS

Features will become apparent to those of skill in the art by describing in detail exemplary embodiments with reference to the attached drawings in which:

FIGS. 1 and 2 illustrate structures of organic light emitting diode devices according to embodiments.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the thickness of layers, films, panels, regions, etc., are exaggerated for clarity. Like reference numerals designate like elements throughout the specification.

In addition, "electron affinity (EA)" may be defined as an absolute value of energy from a vacuum level to a LUMO energy level in the specification.

Hereinafter, an organic light emitting diode device according to one embodiment is described in detail.

FIGS. 1 and 2 illustrate structures of organic light emitting diode devices according to embodiments.

Referring to FIG. 1, an organic light emitting diode device according to one embodiment includes an anode 10, a cathode 20 facing the anode 10, and an emission layer 50 interposed between the anode 10 and the cathode 20, a first hole auxiliary layer 30 interposed between the anode 10 and the emission layer 50, and an electron auxiliary layer 40 interposed between the cathode 20 and the emission layer 50.

A substrate (not shown) may be disposed toward the anode 10 or the cathode 20. The substrate may be formed of, for example, an inorganic material such as glass; an organic material such as polycarbonate, polymethylmethacrylate, polyethyleneterephthalate, polyethylenenaphthalate, polyamide, polyethersulfone, or a combination thereof; or a silicon wafer.

The anode 10 may be a transparent electrode or an opaque electrode. The transparent electrode may be made of, for example, a conductive oxide such as indium tin oxide (ITO), indium zinc oxide (IZO), tin oxide ($SnO_2$), zinc oxide (ZnO), or a combination thereof or a thin metal such as aluminum, silver, or magnesium, while the opaque electrode may be made of, for example, a metal such as aluminum, silver, or magnesium.

The cathode 20 may include a material having a small work function, so that electrons may be easily injected into the cathode 20. For example, the material having a small work function may include a metal such as magnesium, calcium, sodium, potassium, titanium, indium, yttrium, lithium, gadolinium, aluminum silver, tin, lead, cesium, barium, or an alloy thereof; or a multi-layer structure material such as LiF/Al, $LiO_2$/Al, LiF/Ca, LiF/Al, or $BaF_2$/Ca. The cathode may be a metal electrode such as, for example, aluminum.

The emission layer 50 may include a blue, red, or green light emitting material. The emission layer 50 may include a host and a dopant. The dopant may be a phosphorescent dopant.

In an embodiment, the host in the emission layer 50 may be a compound in which nitrogen-containing rings, such as, for example, carbazole, azacarbazole, or condensed carbazole, are linked through a single bond or a C6 to C30 arylene group. The compound may be, for example, CBP, mCP, 2,6-bis(3-(9H-carbazol-9-yl)phenyl)pyridine, 2,6-bis(3-(9H-carbazol-9-yl)phenyl)pyrazine, 9-(4,6-diphenylpyrimidin-2-yl)-3,6-diphenyl-9H-carbazole, 9-(4,6-diphenyl-1,3,5-triazin-2-yl)-9H-carbazole, 9-phenyl-9'-(pyridin-2-yl)-9H,9'H-3,3'-bicarbazole, 9-phenyl-9'-(quinolin-2-yl)-9H,9'H-3,3'-bicarbazole, 9-([1,1'-biphenyl]-3-yl)-9'-(pyridin-2-yl)-9H,9'H-3,3'-bicarbazole, 9-(4,6-diphenyl-1,3,5-triazin-2-yl)-9'-phenyl-9H,9'H-3,3'-bicarbazole, 9-(4,6-diphenylpyrimidin-2-yl)-9'-phenyl-9H,9'H-3,3'-bicarbazole, or 5-phenyl-11-(pyridin-2-yl)-5,11-dihydroindolo[3,2-b]carbazole.

The phosphorescent dopant may be a metal complex, and the metal complex may include a metal of Ir, Pt, or Os.

In an embodiment, the dopant in the emission layer 50 may be, for example, $Ir(ppy)_3$, $Ir(ppy)_2acac$, $(piq)_2Ir(acac)$, or Pt(OEP).

The dopant may be included in an amount of about 3 to about 15 wt % based on 100 wt % of the total weight of the host and the dopant. Maintaining the dopant amount within this range may help prevent saturation of luminary excitons, may help increase luminous efficiency, and may improve roll-off, i.e., efficiency at high brightness levels.

In general, since a phosphorescent host may have a large energy gap, there may be a large barrier for injection of electrons from an electron auxiliary layer. The barrier with the electron auxiliary layer may be decreased by using a phosphorescent host having an electron transport characteristic. However, a smaller energy gap of the host or a larger hole injection barrier may occur.

On the other hand, direct injection of an electron into a phosphorescent light emitter having a lowest unoccupied molecular orbital (LUMO), not through a host, by increasing concentration of the phosphorescent light emitter may help prevent saturation of a light emitting exciton, may help increase luminous efficiency, and may improve roll-off, i.e., efficiency at high brightness levels.

In FIG. 1, the first hole auxiliary layer 30 is positioned between the anode 10 and the emission layer 50 and may increase hole mobility. The first hole auxiliary layer 30 may be, for example, a hole transport layer (HTL). The first hole auxiliary layer 30 may have higher triplet energy (T1) than the emission layer 50. A triplet energy (T1) difference between the first hole auxiliary layer and the emission layer may work as an energy barrier and may help prevent a triplet exciton from diffusing into the first hole auxiliary layer, which may help provide an organic light emitting diode device having a low voltage, high efficiency, and a long life-span.

In an embodiment, the emission layer 50 may include a host and a dopant, and the host and dopant of the emission layer and the triplet energy (T1) of the first hole auxiliary layer may satisfy a relationship of the following Equation 1.

$$0.1\ eV + T_{Dopant} < T_{Host} < T_{HAL(1)} \quad \text{(Equation 1)}$$

In the Equation 1, $T_{Dopant}$ is a triplet energy (T1) level of a dopant of the emission layer, $T_{Host}$ is a triplet energy (T1) level of a host of the emission layer, and $T_{HAL(1)}$ is the triplet energy (T1) of the first hole auxiliary layer level.

Triplet energy (T1) level of the host may be 0.1 eV higher than triplet energy (T1) level of the dopant in the emission layer 50. Thus, a triplet exciton formed from the host in the emission layer may be efficiently transported into the triplet energy (T1) level of the dopant in the emission layer, and may result in a high luminous efficiency.

In addition, the triplet energy (T1) of the first hole auxiliary layer level may be higher than triplet energy (T1) level of the host and dopant in the emission layer. Thus, a triplet exciton in the emission layer may be prevented from diffusing into the first hole auxiliary layer, may be suppressed from extinction, and may improve luminous efficiency.

In an embodiment, the dopant of the emission layer and the triplet energy (T1) of the first hole auxiliary layer may satisfy a relationship of the following Equation 2.

$$0.3\ eV + T_{Dopant} \leq T_{HAL(1)} \quad \text{(Equation 2)}$$

In the Equation 2, $T_{Dopant}$ is a triplet energy (T1) level of a dopant of the emission layer, and $T_{HAL(1)}$ is the triplet energy (T1) of the first hole auxiliary layer level.

The triplet energy (T1) of the first hole auxiliary layer level may be about 0.3 eV higher than the triplet energy (T1) of the dopant in the emission layer level. Thus, a triplet exciton in the emission layer may be more efficiently prevented from diffusing into the first hole auxiliary layer.

In an embodiment, the dopant of the emission layer and the triplet energy (T1) of the first hole auxiliary layer may satisfy a relationship of the following Equation 5.

$$0.2\ eV + T_{Dopant} < T_{HAL(1)} \quad \text{(Equation 5)}$$

In an embodiment, the triplet energy (T1) of the first hole auxiliary layer may be in a range of about 2.4 to about 3.5 eV, and the triplet energy (T1) of the emission layer may be in a range of about 2.0 to about 3.0 eV.

Maintaining the triplet energy (T1) of the first hole auxiliary layer 30 and the emission layer 50 within these ranges may help efficiently store a triplet exciton in the emission layer inside the emission layer, and may improve efficiency and life-span of an organic light emitting diode device.

In an embodiment, the emission layer and the first hole auxiliary layer may be adjacent to each other.

In an embodiment, the first hole auxiliary layer may smoothly transport a hole and include a compound having at least one carbazole group. The carbazole group may help provide excellent hole mobility and thermal stability and, may be included in a compound in the first hole auxiliary layer to help balance charges in an organic light emitting diode device.

In an embodiment, the first hole auxiliary layer may include a compound represented by one of the following Chemical Formulae 1 to 3.

[Chemical Formula 1]

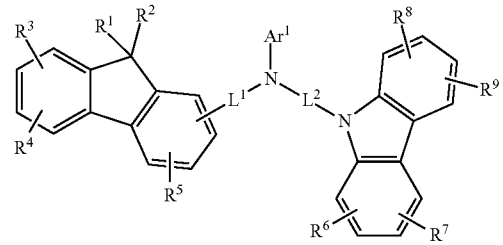

[Chemical Formula 2]

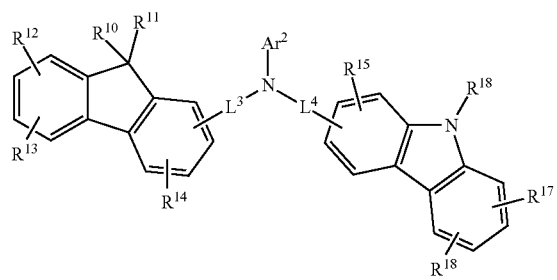

[Chemical Formula 3]

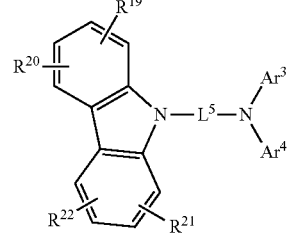

In the above Chemical Formulae 1 to 3,

X is nitrogen (N), boron (B), or phosphorus (P), $R^1$ to $R^{22}$ are each independently hydrogen, deuterium, a halogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C2 to C30 heteroaryl group, a substituted or unsubstituted C3 to C30 silyl group, or a combination thereof, $R^1$ to $R^2$ are present independently or form a fused ring with an adjacent substituent, Ar¹ to Ar⁴ are each independently hydrogen, a substituted or unsubstituted C6 to C30 aryl group, a substituted or unsubstituted C2 to C30 heteroaryl group, or a combination thereof, Ar¹ to Ar⁴ are present independently or form a fused ring with an adjacent substituent, and L¹ to L⁵ are each independently a single bond, a substituted or unsubstituted C1 to C30 alkylene group, a substituted or unsubstituted C6 to C30 arylene group, a substituted or unsubstituted C2 to C30 heteroarylene group, or combination thereof.

The first hole auxiliary layer may further include a p-dopant, which may, for example, improve conductivity. Examples of the p-dopant include a quinine derivative such as tetracyanoquinone dimethane (TCNQ), or 2,3,5,6-tetrafluoro-tetrayano-1,4-benzoquinone dimethane (F4-CTNQ), a metal oxide such as a tungsten oxide or molybdenum oxide, and a cyano group-containing compound represented by the following Chemical Formula 100. In an embodiment, the p-dopant may include more than two cyano groups (—CN).

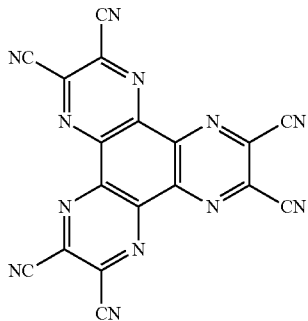

[Chemical Formula 100]

When the first hole auxiliary layer further includes the p-dopant, the p-dopant may be uniformly or non-uniformly dispersed among the layers.

In FIGS. 1 and 2, the electron auxiliary layer 40 is positioned between the cathode 20 and the emission layer 50, and may increase injection and mobility of electrons. The electron auxiliary layer 40 may be, for example, an electron transport layer (ETL) and/or an electron injection layer (EIL).

According to one embodiment, an organic light emitting diode device may further include an electron auxiliary layer 40 between the emission layer and the cathode.

In an embodiment, the emission layer may include a host and a dopant satisfying relationships of the following Equations 3 and 4.

$$0.1\ eV + EA_{EAL} > EA_{Host} \quad \text{(Equation 3)}$$

$$0.1\ eV + EA_{EAL} > EA_{HAL(1)} \quad \text{(Equation 4)}$$

In the Equations 3 and 4, $EA_{EAL}$ is electron affinity of an electron auxiliary layer, $EA_{Host}$ is electron affinity of the host in the emission layer, and $EA_{HAL(1)}$ is electron affinity of the first hole auxiliary layer.

When electron affinity of a host in the emission layer 50, electron affinity of the electron auxiliary layer 40, and electron affinity of the first hole auxiliary layer satisfy the relationships of Equations 3 and 4, electrons may be easily injected from the cathode and transported to the emission layer in tiers, which may appropriately balance charges, lower a driving voltage, and improve the life-span of an organic light emitting diode device.

In an embodiment, the electron auxiliary layer may have electron affinity in a range of about 2.4 to about 3.4 eV, the emission layer may have electron affinity in a range of about 2.0 to about 3.2 eV, and the first hole auxiliary layer may have electron affinity in a range of about 1.8 to about 3.0 eV.

In an embodiment, the electron auxiliary layer may include a nitrogen-containing ring compound. The nitrogen-containing ring may help the electron auxiliary layer adjust electron mobility, and may help appropriately balance charges and improve the life-span and efficiency of an organic light emitting diode device.

In an embodiment, the nitrogen-containing ring may include a substituted or unsubstituted imidazole, a substituted or unsubstituted triazole, a substituted or unsubstituted tetrazole, a substituted or unsubstituted oxadiazole, a substituted or unsubstituted oxatriazole, a substituted or unsubstituted thiatriazole, a substituted or unsubstituted carbazole, a substituted or unsubstituted benzimidazole, a substituted or unsubstituted benztriazole, a substituted or unsubstituted pyridine, a substituted or unsubstituted pyrimidine, a substituted or unsubstituted triazine, a substituted or unsubstituted pyrazine, a substituted or unsubstituted pyridazine, a substituted or unsubstituted quinoline, a substituted or unsubstituted isoquinoline, a substituted or unsubstituted quinoxaline, a substituted or unsubstituted quinazoline, a substituted or unsubstituted acridine, a substituted or unsubstituted phenanthroline, a substituted or unsubstituted phenazine, a substituted or unsubstituted imidazopyridine, tris(8-hydroxyquinolinolato)aluminum, or a combination thereof.

In an embodiment, the nitrogen-containing ring may be, for example, 2-(4-(9,10-di(naphthalen-2-yl)anthracen-2-yl)phenyl)-1-phenyl-1H-benzo[d]imidazole or 2,9-di(naphthalen-2-yl)-4,7-diphenyl-1,10-phenanthroline.

The nitrogen-containing ring indicates a cyclic compound including only nitrogen, carbon, and hydrogen but may not include "a compound including other hetero atoms except for nitrogen."

In addition, "a compound including a benzene ring and a nitrogen-containing aromatic ring" and a compound including an electron donating group (EDG) belong to the cyclic compound including only nitrogen, carbon, and hydrogen but may not be included in the nitrogen-containing ring.

The compounds may not be included in the nitrogen-containing ring of the electron auxiliary layer, since the compounds may hinder fast movement of electrons, may make it difficult to balance charges, and may deteriorate thermal stability and life-span of an organic light emitting diode device.

In an embodiment, the nitrogen-containing ring may not include a compound represented by the following Chemical Formula a, b, or c.

[Chemical Formula a]

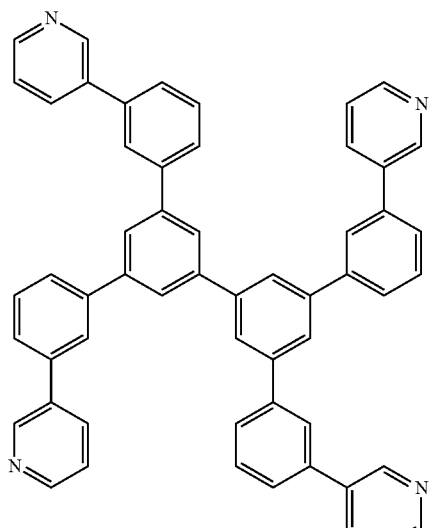

[Chemical Formula b]

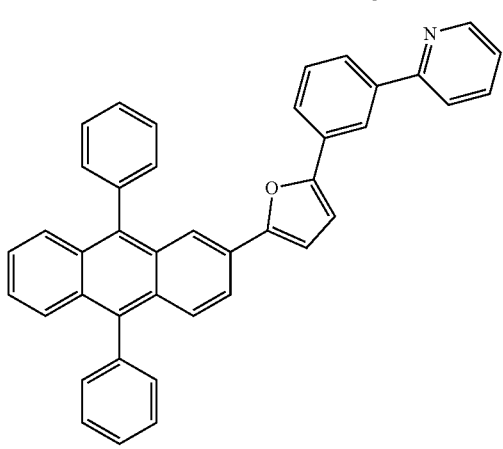

[Chemical Formula c]

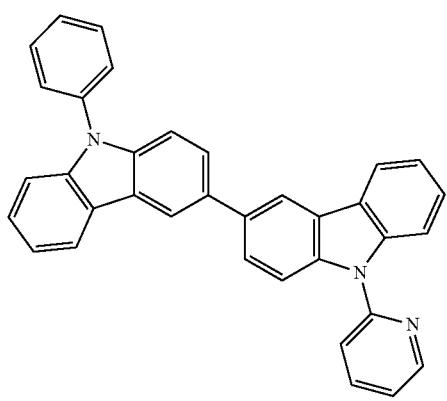

In an embodiment, the electron auxiliary layer may include an electron transporting organic compound and a metal-containing material other than the nitrogen-containing ring. Examples of the electron transporting organic compound include DNA (9,10-di(naphthalen-2-yl)anthracene); and an anthracene-based compound such as a compound represented by the following Chemical Formulae 101 and 102.

[Chemical Formula 101]

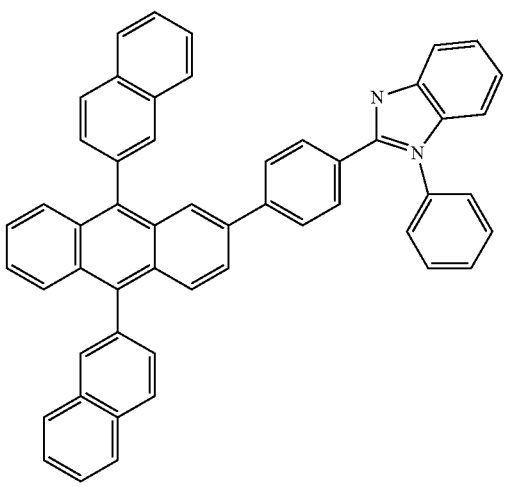

[Chemical Formula 102]

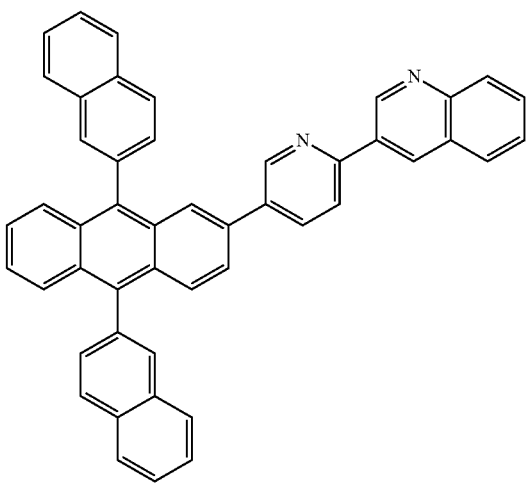

The metal-containing material may include a Li complex. Examples of the Li complex include lithium quinolate (LiQ), and a compound represented by the following Chemical Formula 103.

[Chemical Formula 103]

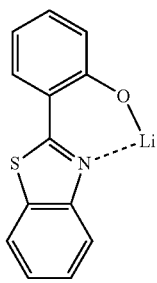

In an embodiment, the electron auxiliary layer may be thinner than the first hole auxiliary layer. When the electron auxiliary layer is thinner than the first hole auxiliary layer, holes and electrons may have a balanced movement, and a hole blocking layer may be omitted, and life-span deterioration of an organic light emitting diode device may be prevented. In an embodiment, the first hole auxiliary layer may have a thickness ranging from about 200 to about 1500 Å, and the electron auxiliary layer may have a thickness ranging from about 50 to about 500 Å. In an embodiment, the first hole auxiliary layer may have a thickness ranging from about 300 to about 600 Å, and the electron auxiliary layer may have a thickness ranging from about 200 to about 400 Å.

Hereinafter, an organic light emitting diode device according to one embodiment is illustrated referring to FIG. 2.

Referring to FIG. 2, an organic light emitting diode device according to another embodiment like that of the above-described embodiment includes an anode 10 and a cathode 20 facing each other, an emission layer 50 interposed between the anode 10 and the cathode 20, a first hole auxiliary layer 30 interposed between the anode 10 and the emission layer 50, and an electron auxiliary layer 40 interposed between the cathode 20 and the emission layer 50.

The organic light emitting diode device illustrated in FIG. 2, as compared to the organic light emitting diode device illustrated in FIG. 1, further includes a second hole auxiliary layer 60 interposed between the anode 10 and the first hole auxiliary layer 30.

The second hole auxiliary layer may decrease driving voltage of an organic light emitting diode device and may improve its life-span, though the organic light emitting diode device may be manufactured without using another organic layer such as an electron blocking layer having a deterioration problem.

The second hole auxiliary layer may play a role of injecting and transporting a hole. The second hole auxiliary layer may include, for example, N-([1,1'-biphenyl]-4-yl)-9,9-dimethyl-N-(4-(9-phenyl-9H-carbazol-3-yl)phenyl)-9H-fluoren-2-amine, N-([1,1'-biphenyl]-4-yl)-9,9-diphenyl-N-(4-(9-phenyl-9H-carbazol-3-yl)phenyl)-9H-fluoren-2-amine, or a compound represented by the following Chemical Formula 4.

[Chemical Formula 104]

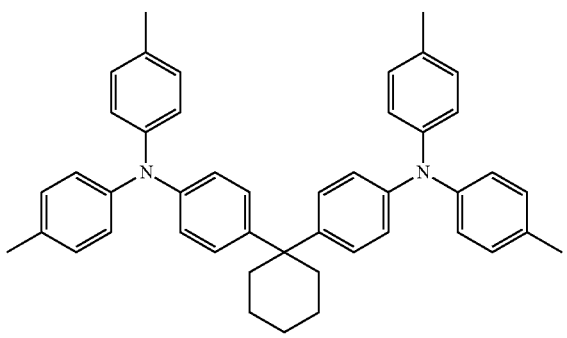

For example, an organic light emitting diode device according to one embodiment may include an anode/a hole injection layer (HIL)/an emission layer/a cathode, an anode/a hole injection layer (HIL)/a hole transport layer (HTL)/an emission layer/an electron transport layer (ETL)/a cathode, or an anode/a hole injection layer (HIL)/a hole transport layer (HTL)/an emission layer/an electron transport layer (ETL)/an electron injection layer (EIL)/a cathode structure. In addition, the organic light emitting diode device may have a structure of an anode/a function layer simultaneously injecting and transporting a hole/an emission layer/an electron transport layer (ETL)/a cathode, or an anode/a function layer simultaneously injecting and transporting a hole/an emission layer/an electron transport layer (ETL)/an electron injection layer (EIL)/a cathode. In addition, the organic light emitting diode device may have a structure of an anode/a hole transport layer (HTL)/an emission layer/a function layer simultaneously injecting and transporting an electron/a cathode, an anode/a hole injection layer (HIL)/an emission layer/a function layer simultaneously injecting and transporting an electron/a cathode, or an anode/a hole injection layer (HIL)/a hole transport layer (HTL)/an emission layer/a function layer simultaneously injecting and transporting an electron/a cathode.

According to one embodiment, an organic light emitting diode device may have various structures such as, for example, a front-side light emitting type, a rear-side light emitting type, or a both side light emitting type.

According to one embodiment, an organic light emitting diode device may be mounted in a flat panel display, for example, a passive matrix organic light emitting diode (OLED) display and an active matrix organic light emitting diode (OLED) display. When the organic light emitting diode is mounted in the device active matrix organic light emitting diode (OLED) display, a lower electrode may be a pixel electrode and electrically connected to a thin film transistor. In addition, the organic light emitting diode device according to one embodiment may include a first layer formed by depositing an organic compound according to one embodiment or by coating an organic material prepared in form of a solution in a wet method according to one embodiment.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Example 1

An ITO glass substrate was cut into a size of 50 mm×50 mm×0.5 mm and then, respectively ultrasonic wave-cleaned in acetone isopropyl alcohol and pure water for 15 minutes and UV ozone-cleaned for 30 minutes. Subsequently, a compound represented by Chemical Formula 5 was vacuum-deposited to form a 1200 Å-thick first hole auxiliary layer on the ITO glass substrate. Subsequently, CBP (Samsung Display Co., Ltd.) and 5 wt % of PGD1 (Samsung Display Co., Ltd.) were vacuum-deposited on the first hole auxiliary layer to form a 400 Å-thick emission layer. Subsequently, Alq3 (Samsung Display Co., Ltd.) was vacuum-deposited to form a 300 Å-thick electron auxiliary layer on the emission layer upper. On the electron auxiliary layer, 10 Å-thick LiF and 2000 Å-thick Al (a cathode) were sequentially vacuum-deposited, manufacturing an organic light emitting diode device.

[Chemical Formula 5]

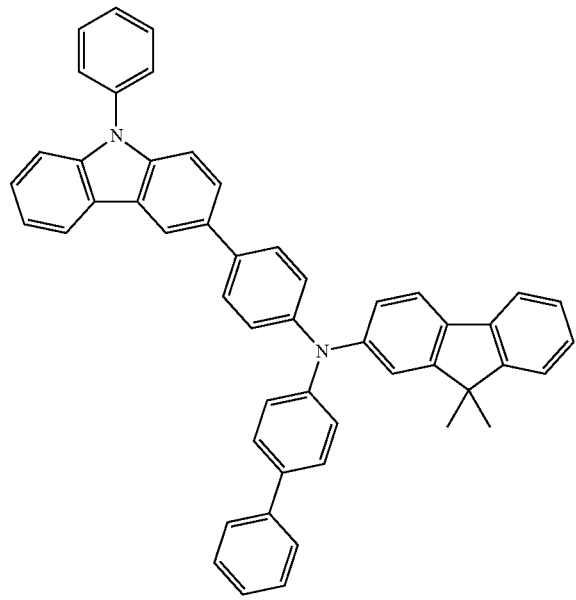

[CBP]

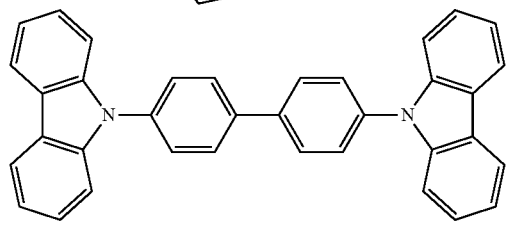

[PGD1]

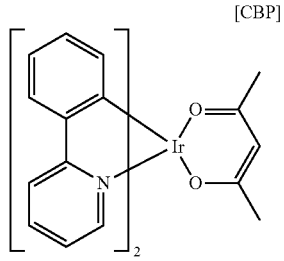

[Alq3]

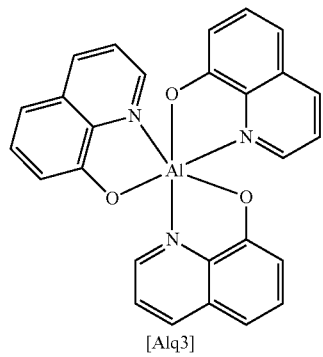

Example 2

An organic light emitting diode device was manufactured according to the same method as Example 1 except for using a second hole auxiliary layer formed of a compound represented by Chemical Formula 4 and a 600 Å-thick first hole auxiliary layer formed of a compound represented by Chemical Formula 5 instead of the single first hole auxiliary layer.

[Chemical Formula 4]

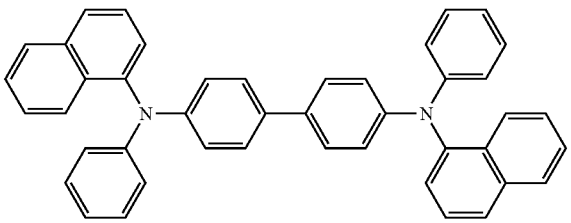

Comparative Example 1

An organic light emitting diode device was manufactured according to the same method as Example 1 except for NPB (Samsung Display Co., Ltd.) instead of the compound represented by Chemical Formula 5 to form the first hole auxiliary layer.

[NPD]

Comparative Example 2

An organic light emitting diode device was manufactured according to the same method as Example 2 except for using a compound represented by Chemical Formula 5 instead of the compound represented by Chemical Formula 4 to form the second hole auxiliary layer and NPB instead of the compound represented by Chemical Formula 5 to form the first hole auxiliary layer.

Comparative Example 3

An organic light emitting diode device was manufactured according to the same method as Example 1 except for using a compound represented by Chemical Formula 4 instead of the compound represented by Chemical Formula 5 to form the first hole auxiliary layer.

Evaluation 1

T1 level and electron affinity of the compounds represented by Chemical Formulae 4 and 5 and compounds represented by CBP, PGD1, NPB, and Alq3 are provided in Table 1.

The T1 level and electron affinity were respectively measured by using a 77K low temperature PL and CV.

TABLE 1

| Materials | | T1 level | Electron affinity |
|---|---|---|---|
| Second hole auxiliary layer (Example) | Compound represented by Chemical Formula 4 | 2.8 eV | 2.0 eV |
| First hole auxiliary layer (Example) | Compound represented by Chemical Formula 5 | 2.7 eV | 2.5 eV |
| Host of emission layer (Example, Comparative Example) | CBP | 2.6 eV | 2.6 eV |
| Dopant of emission layer (Example, Comparative Example) | PGD1 | 2.4 eV | 3.0 eV |
| First and second hole auxiliary layers (Comparative Example) | NPB | 2.3 eV | 2.4 eV |
| Electron auxiliary layer (Example, Comparative Example) | Alq3 | 2.1 eV | 3.0 eV |

Evaluation 2

Driving voltage, current density, efficiency, and life-span LT90 of the organic light emitting diodes according to Examples 1 and 2 and Comparative Examples 1 to 3 were measured, and the results are provided in Table 2.

The efficiency was measured by supplying the organic light emitting diodes with electricity in a current-voltage system (Kethley SMU 236) and using a luminance meter PR650.

The life-span LT90 indicates a time (hr) taken until the organic light emitting diodes showed luminance of 90% based on 100% of the initial luminance. (current density: 10 mA/cm$^2$)

TABLE 2

| | Efficiency (cd/A) | Driving voltage (V) | Life-span (hr) |
|---|---|---|---|
| Comparative Example 1 (reference) | 100% | 100% | 100% |
| Comparative Example 2 | 103% | 102% | 109% |
| Comparative Example 3 | 125% | 122% | 113% |
| Example 1 | 152% | 85% | 201% |
| Example 2 | 165% | 74% | 187% |

Referring to Table 2, the organic light emitting diodes according to Examples 1 and 2 showed a lower driving voltage but improved efficiency and life-span characteristics compared with the organic light emitting diode using a single first hole auxiliary layer having a lower T1 level than that of a phosphorescent dopant according to Comparative Example 1, the organic light emitting diode using a first hole auxiliary layer having a lower T1 level than that of a phosphorescent dopant according to Comparative Example 2, the organic light emitting diode using a first hole auxiliary layer having a higher T1 level than that of a phosphorescent dopant but including no carbazole according to Comparative Example 3.

By way of summation and review, an LCD uses a separate backlight, being a non-emissive device, and may be relatively limited in terms of, for example, response speed and viewing angle. Use of an organic light emitting diode device as a display device may provide benefits relative thereto. The organic light emitting diode device is a self-light emitting display device that may have a wide viewing angle, improved contrast, and a fast response time. The organic light emitting diode device emits a light when electrons injected from one electrode are combined with holes injected from the other electrode and form excitons and emit energy.

One embodiment provides an organic light emitting diode device that may have a lowered driving voltage, and improved efficiency and life-span characteristics. The organic light emitting diode device using an organic material efficiently restricting energy excited from an emission layer therein may have high efficiency, a low voltage, high luminance, and a long life-span.

Exemplary embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode device, comprising:
   an anode and a cathode facing each other,
   an emission layer interposed between the anode and the cathode, and
   a first hole auxiliary layer interposed between the anode and the emission layer,
   wherein: the emission layer includes a host and a dopant, and $$T_{Dopant} < T_{Host} < T_{HAL(1)} \quad \text{(Equation 1)}$$

wherein, in the Equation 1,
   $T_{Dopant}$ is a triplet energy (T1) level of the dopant, $T_{Host}$ is a triplet energy (T1) level of the host, and $T_{HAL(1)}$ is a triplet energy (T1) level of the first hole auxiliary layer.

2. The organic light emitting diode device as claimed in claim 1, wherein:

$$0.3 \text{ eV} + T_{Dopant} \leq T_{HAL(1)} \quad \text{(Equation 2)}$$

wherein, in the Equation 2,
   $T_{Dopant}$ is a triplet energy (T1) level of the dopant, and $T_{HAL(1)}$ is a triplet energy (T1) level of the first hole auxiliary layer.

3. The organic light emitting diode device as claimed in claim 1, wherein:
   the triplet energy (T1) of the first hole auxiliary layer is in a range of about 2.4 to about 3.5 eV, and
   the triplet energy (T1) of the emission layer is in a range of about 2.0 to about 3.0 eV.

4. The organic light emitting diode device as claimed in claim 1, wherein the emission layer and the first hole auxiliary layer are adjacent to each other.

5. The organic light emitting diode device as claimed in claim 1, further comprising a second hole auxiliary layer between the first hole auxiliary layer and the anode.

6. The organic light emitting diode device as claimed in claim 1, wherein the first hole auxiliary layer includes a compound having at least one carbazole group.

7. The organic light emitting diode device as claimed in claim 1, wherein the first hole auxiliary layer includes a compound represented by one of Chemical Formulae 1 to 3:

[Chemical Formula 1]

[Chemical Formula 2]

[Chemical Formula 3]

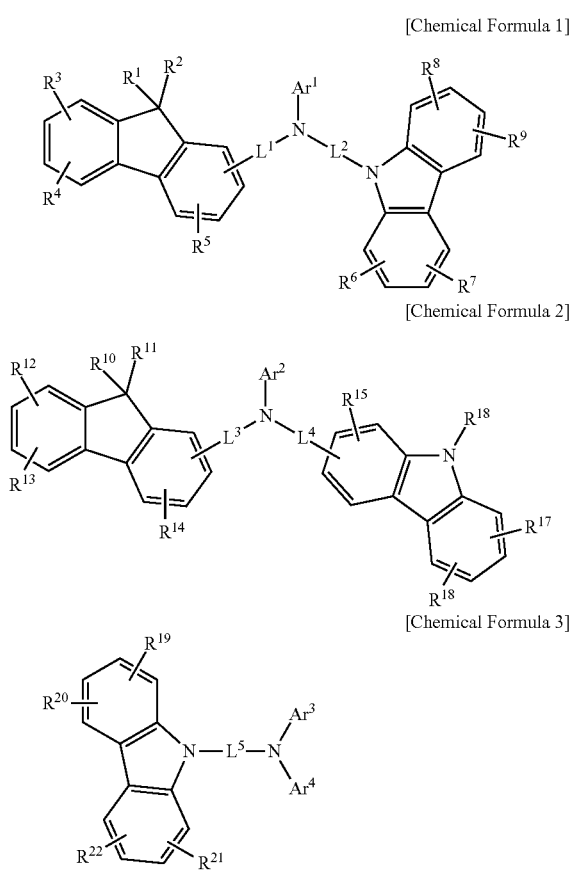

wherein, in Chemical Formulae 1 to 3,

X is nitrogen (N), boron (B), or phosphorus (P), $R^1$ to $R^{22}$ are each independently hydrogen, deuterium, a halogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C2 to C30 heteroaryl group, a substituted or unsubstituted C3 to C30 silyl group, or a combination thereof, $R^1$ to $R^{22}$ are present independently or form a fused ring with an adjacent substituent, $Ar^1$ to $Ar^4$ are each independently hydrogen, a substituted or unsubstituted C6 to C30 aryl group, a substituted or unsubstituted C2 to C30 heteroaryl group, or a combination thereof, $Ar^1$ to $Ar^4$ are present independently or form a fused ring with an adjacent substituent, and $L^1$ to $L^5$ are each independently a single bond, a substituted or unsubstituted C1 to C30 alkylene group, a substituted or unsubstituted C6 to C30 arylene group, a substituted or unsubstituted C2 to C30 heteroarylene group, or combination thereof.

8. The organic light emitting diode device as claimed in claim 1, further comprising an electron auxiliary layer between the emission layer and the cathode.

9. The organic light emitting diode device as claimed in claim 8, wherein: the emission layer includes a host and a dopant, and $$0.1 \text{ eV} + EA_{EAL} > EA_{Host} \quad \text{(Equation 3)}$$

$$0.1 \text{ eV} + EA_{EAL} > EA_{HAL(1)} \quad \text{(Equation 4)}$$

wherein, in the Equations 3 and 4, $EA_{EAL}$ is electron affinity of an electron auxiliary layer, $EA_{Host}$ is electron affinity of the host, and $EA_{HAL(1)}$ is electron affinity of the first hole auxiliary layer.

10. The organic light emitting diode device as claimed in claim 9, wherein:

the electron auxiliary layer has electron affinity in a range of about 2.4 to about 3.4 eV, the emission layer has electron affinity in a range of about 2.0 to about 3.2 eV, and the first hole auxiliary layer has electron affinity in a range of about 1.8 to about 3.0 eV.

11. The organic light emitting diode device as claimed in claim 8, wherein the electron auxiliary layer includes a nitrogen-containing ring compound.

12. The organic light emitting diode device as claimed in claim 11, wherein the nitrogen-containing ring includes a substituted or unsubstituted imidazole, a substituted or unsubstituted triazole, a substituted or unsubstituted tetrazole, a substituted or unsubstituted oxadiazole, a substituted or unsubstituted oxatriazole, a substituted or unsubstituted thiatriazole, a substituted or unsubstituted carbazole, a substituted or unsubstituted benzimidazole, a substituted or unsubstituted benztriazole, a substituted or unsubstituted pyridine, a substituted or unsubstituted pyrimidine, a substituted or unsubstituted triazine, a substituted or unsubstituted pyrazine, a substituted or unsubstituted pyridazine, a substituted or unsubstituted quinoline, a substituted or unsubstituted isoquinoline, a substituted or unsubstituted quinoxaline, a substituted or unsubstituted quinazoline, a substituted or unsubstituted acridine, a substituted or unsubstituted phenanthroline, a substituted or unsubstituted phenazine, a substituted or unsubstituted imidazopyridine, tris(8-hydroxyquinolinolato)aluminum, or a combination thereof.

13. The organic light emitting diode device as claimed in claim 8, wherein the electron auxiliary layer is thinner than the first hole auxiliary layer.

14. The organic light emitting diode device as claimed in claim 1, wherein the dopant is a phosphorescent dopant.

15. The organic light emitting diode device as claimed in claim 9, wherein the dopant is a phosphorescent dopant.

16. The organic light emitting diode device as claimed in claim 1:

wherein Equation 1 further includes, $$0.1 \text{ eV} + T_{Dopant} < T_{Host} < T_{HAL(1)} \quad \text{(Equation 1)}.$$

17. An organic light emitting diode device, comprising:

an anode and a cathode facing each other, an emission layer interposed between the anode and the cathode, a first hole auxiliary layer interposed between the anode and the emission layer, an electron auxiliary layer between the emission layer and the cathode and wherein: the emission layer includes a host and a dopant, and $$0.1 \text{ eV} + EA_{EAL} > EA_{Host} \quad \text{(Equation 3)}$$

$$0.1 \text{ eV} + EA_{EAL} > EA_{HAL(1)} \quad \text{(Equation 4)}$$

wherein, in the Equations 3 and 4, $EA_{EAL}$ is electron affinity of an electron auxiliary layer, $EA_{Host}$ is electron affinity of the host, and $EA_{HAL(1)}$ is electron affinity of the first hole auxiliary layer.

18. The organic light emitting diode device as claimed in claim 17, the electron auxiliary layer has electron affinity in a range of about 2.4 to about 3.4 eV, the emission layer has electron affinity in a range of about 2.0 to about 3.2 eV, and the first hole auxiliary layer has electron affinity in a range of about 1.8 to about 3.0 eV.

19. The organic light emitting diode device as claimed in claim 17, wherein the electron auxiliary layer includes a nitrogen-containing ring compound.

20. The organic light emitting diode device as claimed in claim 18, wherein the nitrogen-containing ring includes a substituted or unsubstituted imidazole, a substituted or unsubstituted triazole, a substituted or unsubstituted tetrazole, substituted or unsubstituted oxadiazole, a substituted or unsubstituted oxatriazole, a substituted or unsubstituted thiatriazole, a substituted or unsubstituted carbazole, a substituted or unsubstituted benzimidazole, a substituted or unsubstituted benztriazole, a substituted or unsubstituted pyridine, a substituted or unsubstituted pyrimidine, a substituted or unsubstituted triazine, a substituted or unsubstituted pyrazine, a substituted or unsubstituted pyridazine, a substituted or unsubstituted quinoline, a substituted or unsubstituted isoquinoline, a substituted or unsubstituted quinoxaline, a substituted or unsubstituted quinazoline, a substituted or unsubstituted acridine, a substituted or unsubstituted phenanthroline, a substituted or unsubstituted phenazine, a substituted or unsubstituted imidazopyridine, tris(8-hydroxyquinolinolato)aluminum, or a combination thereof.

21. The organic light emitting diode device as claimed in claim 17, wherein the electron auxiliary layer is thinner than the first hole auxiliary layer.

22. The organic light emitting diode device as claimed in claim 17, wherein the dopant is a phosphorescent dopant.

23. The organic light emitting diode device as claimed in claim 17, wherein $$0.1\ eV + T_{Dopant} < T_{Host} < T_{HAL(1)} \quad \text{(Equation 1)}.$$

* * * * *